(12) United States Patent
Venkatraman

(10) Patent No.: US 6,852,634 B2
(45) Date of Patent: Feb. 8, 2005

(54) LOW COST METHOD OF PROVIDING A SEMICONDUCTOR DEVICE HAVING A HIGH CHANNEL DENSITY

(75) Inventor: Prasad Venkatraman, Gilbert, AZ (US)

(73) Assignee: Semiconductor Components Industries L.L.C., Phoenix, AZ (US)

(*) Notice: Subject to any disclaimer, the term of this patent is extended or adjusted under 35 U.S.C. 154(b) by 302 days.

(21) Appl. No.: 10/184,187

(22) Filed: Jun. 27, 2002

(65) Prior Publication Data

US 2004/0002222 A1 Jan. 1, 2004

(51) Int. Cl.$^7$ ............................................. H01L 21/302
(52) U.S. Cl. .................. 438/694; 438/697; 438/700; 438/704; 438/705; 438/745
(58) Field of Search ................................. 438/694, 697, 438/700, 704, 705, 745

(56) References Cited

U.S. PATENT DOCUMENTS

| | | | |
|---|---|---|---|
| 4,376,286 A | 3/1983 | Lidow et al. | |
| 4,399,449 A | 8/1983 | Herman et al. | |
| 4,412,242 A | 10/1983 | Herman et al. | |
| 4,593,302 A | 6/1986 | Lidow et al. | |
| 4,642,666 A | 2/1987 | Lidow et al. | |
| 4,672,407 A | 6/1987 | Nakagawa et al. | |
| 4,680,853 A | 7/1987 | Lidow et al. | |
| 4,705,759 A | 11/1987 | Lidow et al. | |
| 4,789,882 A | 12/1988 | Lidow | |
| 4,959,699 A | 9/1990 | Lidow et al. | |
| 4,974,059 A | 11/1990 | Kinzer | |
| 5,008,725 A | 4/1991 | Lidow et al. | |
| 5,130,767 A | 7/1992 | Lidow et al. | |
| 5,191,396 A | 3/1993 | Lidow et al. | |
| 5,338,961 A | 8/1994 | Lidow et al. | |
| 5,341,011 A | 8/1994 | Hshieh et al. | |
| 5,418,394 A | 5/1995 | Hertrich | |
| 5,474,943 A | 12/1995 | Hshieh et al. | |
| 6,097,039 A | 8/2000 | Peters et al. | |
| 6,313,504 B1 | 11/2001 | Furuta et al. | |
| 6,346,726 B1 | 2/2002 | Herman | |
| 6,358,818 B1 * | 3/2002 | Wu ............................ 438/431 |
| 6,372,583 B1 * | 4/2002 | Tyagi ......................... 438/300 |
| 6,579,768 B2 * | 6/2003 | Thwaite et al. ............. 438/296 |
| 6,638,813 B1 * | 10/2003 | Tzeng et al. ................ 438/244 |
| 6,767,835 B1 * | 7/2004 | Nariman et al. ............ 438/710 |

FOREIGN PATENT DOCUMENTS

EP          09231372 A    6/1999    ........... H01L/29/78

* cited by examiner

*Primary Examiner*—Nadine G. Norton
*Assistant Examiner*—Binh X. Tran
(74) *Attorney, Agent, or Firm*—James J. Stipanuk; Kevin B. Jackson

(57) ABSTRACT

A method of making a semiconductor device 10 by forming a first dielectric layer 140 on a substrate, etching through the first dielectric layer to form a trench 150 having a channel region 135 on a sidewall 160 of the trench, and laterally removing a portion of the first dielectric layer adjacent to the sidewall of the trench above the channel region for defining a source region 280 of the semiconductor device.

20 Claims, 5 Drawing Sheets

US 6,852,634 B2

LOW COST METHOD OF PROVIDING A SEMICONDUCTOR DEVICE HAVING A HIGH CHANNEL DENSITY

BACKGROUND OF THE INVENTION

The present invention relates in general to semiconductor devices and, more particularly, to providing a low cost, high channel density, trench gate transistor.

Trench power metal oxide semiconductor field effect transistor (MOSFET) devices are used in many applications including power supplies, battery chargers, computers, and cell phones. An important characteristic of a trench power MOSFET device is its on-resistance ($R_{DS(ON)}$). For a given device area, it is desirable to minimize the $R_{DS(ON)}$ of the power MOSFET. Trench power MOSFETs are typically fabricated using a large number of cells. Each individual cell is itself a small trench gated transistor. By connecting these cells in parallel, it is possible to achieve a high current carrying capability, and low $R_{DS(ON)}$ for the device. A typical trench power MOSFET typically has between 1,000 and 1,000,000 cells. Each cell comprises a gate structure in a trench, a diffused base region between adjacent trenches for providing a channel, a diffused source region adjacent to each trench and the top surface, and a base contact region at the top surface. The base contact region in the cell is necessary in order to avoid a floating base condition, which would adversely affect the breakdown voltage and the avalanche energy capability of the device.

One way to achieve a lower $R_{DS(ON)}$ for the device is to increase the channel density, which is the effective width of channel per unit area of the device. The cell density typically is increased by decreasing the dimensions of each cell. However, as the cell dimensions shrink, the width of the source region becomes smaller and more difficult to manufacture using low cost photolithography equipment. Thus, to reduce the cell size, more expensive and complex photolithographic equipment and processes are required to maintain control over the cell dimensions to avoid introducing defects that adversely effect transistor performance.

The more expensive lithographic equipment and complex processes previously needed to achieve a small cell size result in increasing the overall cost of fabricating the power MOSFET device.

Hence, there is a need for a power trench MOSFET semiconductor device having a small cell size and a method of making this device at low cost.

DETAILED DESCRIPTION OF THE DRAWINGS

In the figures, elements having the same reference number have similar functionality.

Figure 1:
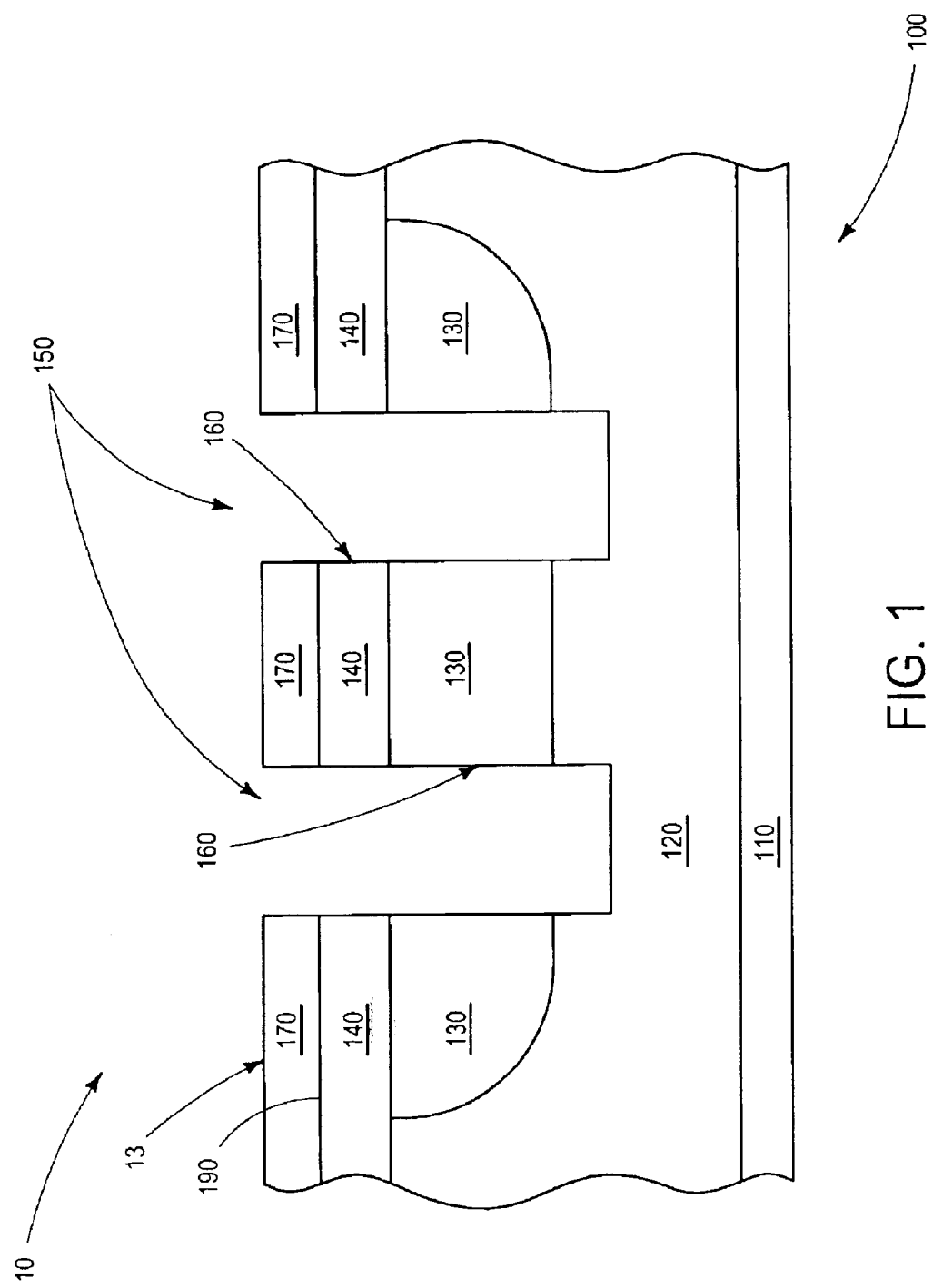
FIG. 1 is a cross-sectional view of an semiconductor device after a first fabrication stage.

FIG. 1 is a cross-sectional view of a semiconductor device configured as a transistor 10 formed with a semiconductor substrate 100 after a first processing stage.

Semiconductor substrate 100 includes a layer 110 having a n+ doping formed to have a thickness of about six-hundred and twenty five micrometers. In one embodiment, layer 110 is heavily doped to have a n+ type conductivity and a resistivity of about 0.001–0.02 ohm-centimeters to function as a conduction electrode for semiconductor device 10. In one embodiment, layer 110 comprises monocrystalline silicon.

An epitaxial layer is grown over layer 110 to a thickness between about two to twenty micrometers over layer 110 to form a drain region 120. In one embodiment, epitaxial layer 120 comprises monocrystalline silicon doped to have a n− type conductivity and a resistivity between about 0.1 and about 10.0 ohm-centimeters.

Substrate 100 is then subjected to an ion implantation step to form a base region referred to as a layer 130 of opposite conductivity type. In one embodiment, layer 130 has a thickness of about one to three micrometers and is doped to have a p− type conductivity between about $1.0 \times 10^{17}$ cm$^{-3}$ and about $5 \times 10^{17}$ cm$^{-3}$ at the surface.

A dielectric layer 140 is formed on layer 130 to a thickness between about two thousand and about five thousand Angstroms to form a hard mask. In one embodiment, dielectric layer 140 is formed with a thermally grown silicon dioxide.

A dielectric layer 170 is formed over dielectric layer 140. In one embodiment dielectric layer 170 is formed with low pressure chemical vapor deposition (LPCVD) as a silicon nitride to a thickness of about one thousand to two thousand Angstroms.

A surface 13 of substrate 100 is patterned with photoresist to mask a series of standard etch steps that remove exposed portions of dielectric layer 170 and dielectric layer 140. A standard anisotropic silicon etch is then applied to remove exposed portions of layer 130 and a portion of drain region or layer 120 to concurrently form trench 150 for forming transistors and other active devices.

A sacrificial oxide layer (not shown) is then grown to a thickness of about five hundred to two-thousand Angstroms over the surface of the trench 150 to remove surfaces damaged by the anisotropic etch.

Figure 2:
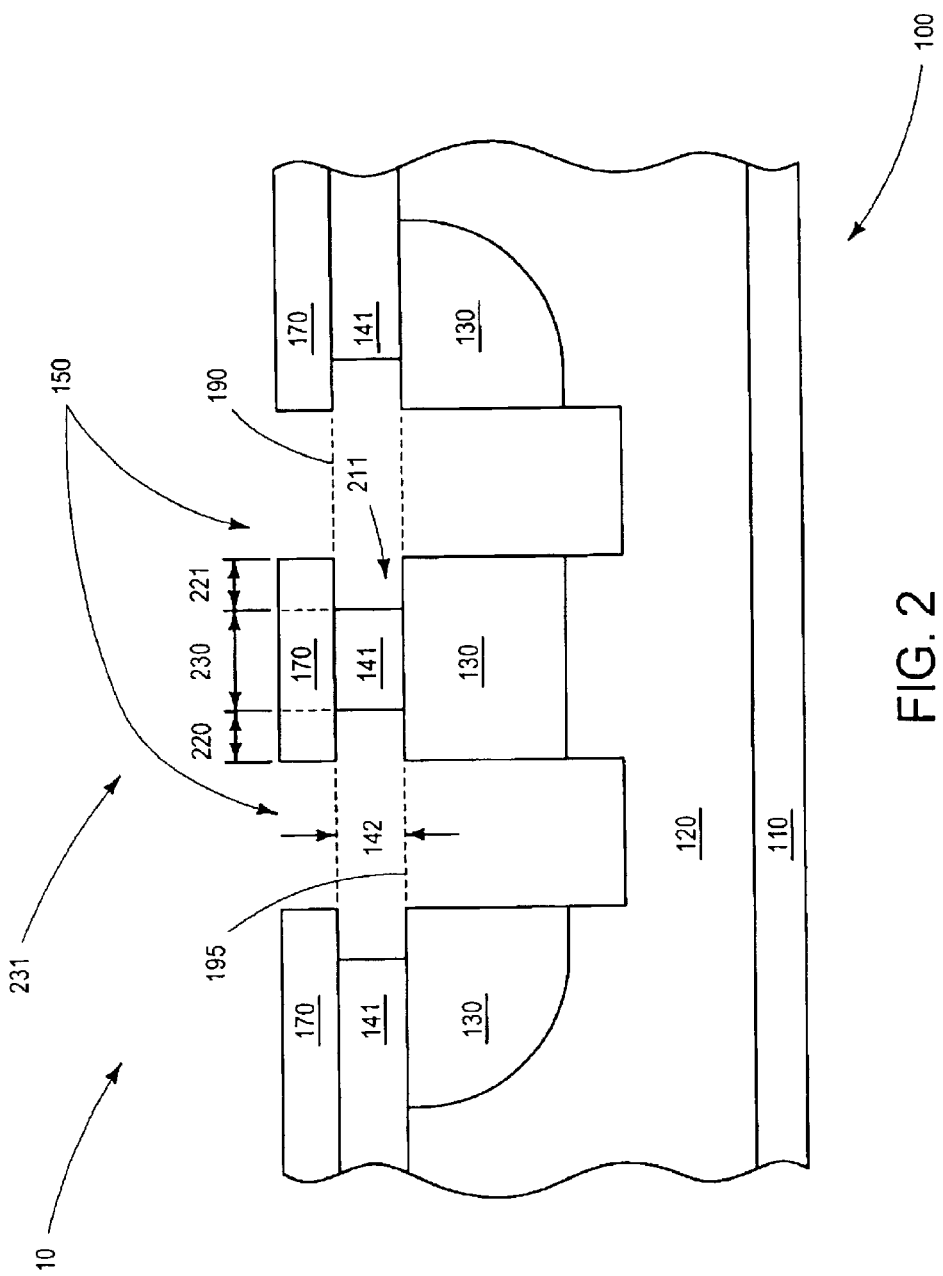
FIG. 2 is a cross-sectional view of the semiconductor device after a second fabrication stage.

FIG. 2 shows a cross-sectional view of transistor 10 after a second fabrication stage. A standard wet chemistry etch or isotropic plasma etch is used to selectively remove the sacrificial oxide layer (not shown) and portions of dielectric layer 140 to leave a masking portion 141 of dielectric 140 under the dielectric layer 170 as shown.

Standard wet chemistry or isotropic plasma etching removes material from dielectric layer 140 in a predominantly lateral or horizontal direction 211 and in substantially equal amounts from each sidewall 160. Hence, dielectric layer 140 is undercut by substantially equal distances 220 and 221 determined by the duration of the standard wet chemistry or isotropic plasma etch step. Thus, by varying the time of the wet chemistry or isotropic plasma etch, masking portion 141 is formed by laterally etching dielectric layer 140 to produce controlled lateral dimension 230 above surface 195 of base region 130 as shown.

Therefore, a small, well controlled feature size of masking portion 141 is achieved using the above process combined with a photolithography process needing only to resolve the spacing between adjacent trenches 150, i.e., the sum of dimensions 220, 230 and 221. Such a photolithography process requires less expensive equipment and simpler processing while forming a precisely located masking portion 141 at a low fabrication cost.

The simple timed etch as described above is thus used to define the dimension 230, 220 and 221. In addition, as dimension 220 and dimension 221 are substantially similar, masking portion 141 is self-centered between adjacent trenches 150.

During the above described etch process, the terms "undercutting" or "predominantly horizontal direction" refer to the fact that by selecting the proper etch chemistry, a wet chemistry or isotropic plasma etch will have a high selectivity to the material of dielectric layer 140, i.e., silicon dioxide, in one embodiment. Hence, little if any material is removed from either layer 130 or dielectric layer 170. In one embodiment where layer 170 is formed of silicon nitride, layer 140 is formed of silicon dioxide, and layer 130 is a base region, the timed wet chemistry etch is performed using a 10:1 solution of hydrogen fluoride (HF) and ammonium fluoride (NH4F). In an alternative embodiment, a timed isotropic plasma etch is substituted for the wet etch above to selectively etch above surface or plane 195 or below surface or plane 190 to remove a portion of layer 140, wherein the etching occurs predominantly in a direction perpendicular 211 to the wall 160 of trench 150.

Figure 3:
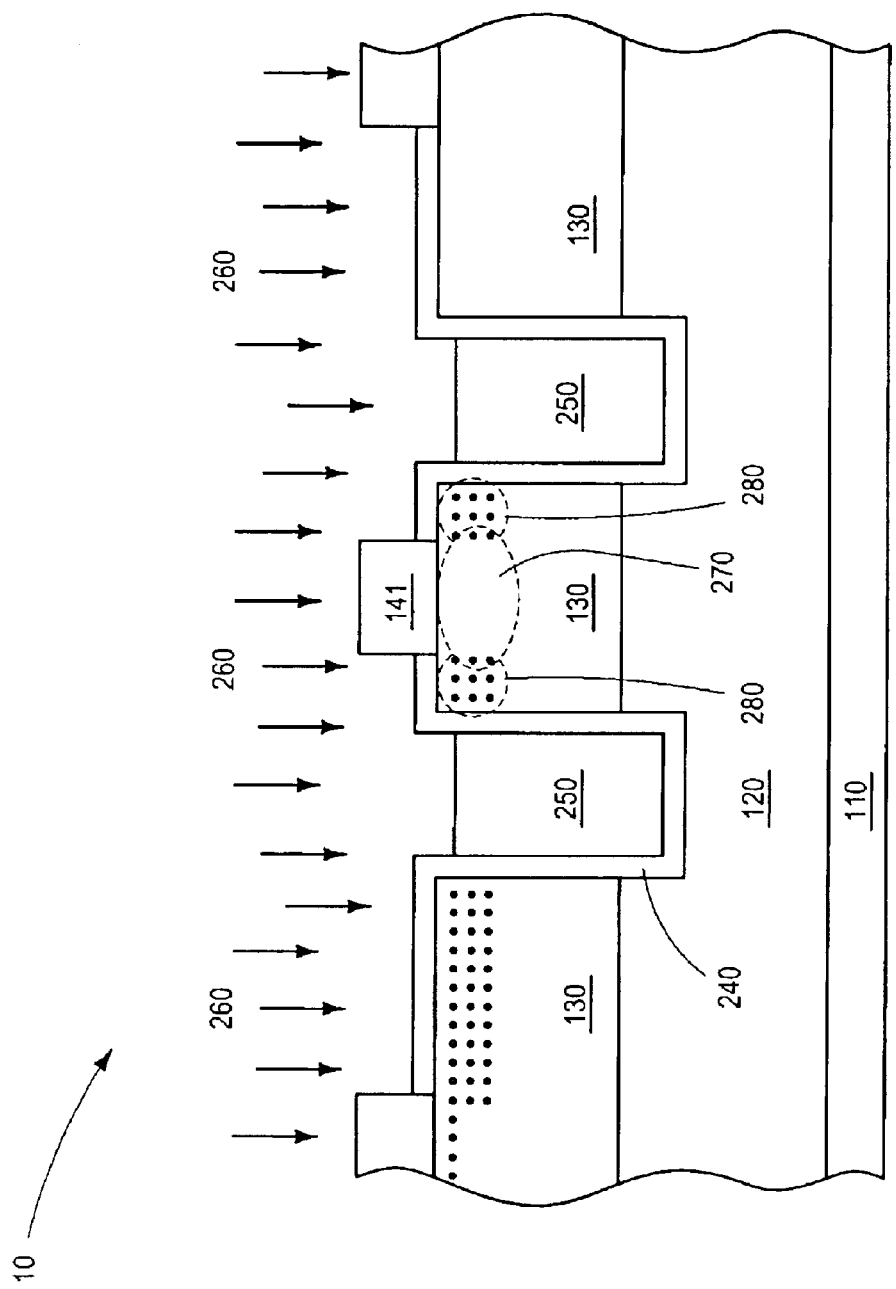
FIG. 3 is a cross-sectional view of the semiconductor device after a third fabrication stage.

FIG. 3 shows a cross-sectional view of transistor 10 after a third fabrication stage. Dielectric material 170 is removed using a timed etch. In one embodiment, the timed etch process is performed using a wet chemistry etch comprising a solution of hot phosphoric acid.

A dielectric material 240 is then grown on substrate 100. In one embodiment, dielectric material 240 includes silicon dioxide thermally grown in an oxygen ambient, at a temperature of about eight hundred to one-thousand degrees centigrade for about thirty to sixty minutes. Dielectric material 240 typically has a dielectric constant of about 3.9 and is formed to a thickness of about one hundred to one-thousand angstroms to function as a gate oxide of transistor 100.

A conductive material 250 is then deposited onto substrate 100 covering the substrate and filling the trench 150. In one embodiment, conductive material 250 includes polysilicon deposited using chemical vapor deposition. Conductive material 250 is then removed from above the trench 150 using standard planarization techniques. In one embodiment, planarization is performed using reactive ion etching. In an alternative embodiment, the planarization may be performed using chemical mechanical polishing (CMP).

The substrate is then subjected to an ion implantation step to introduce n+ type dopants 260 into the base region 130 to form source regions 280 using the masking portion 141 as a implant mask. The implant mask or masking portion 141 thus prevents dopants from entering the blocked implant or base contact region 270. Since the dimension 230 of the masking portion 141 is precisely controlled and masking portion 141 is self centered, the source region 280 or base contact region 270 can be made small without having to have the additional space required to allow for misaligned regions. Additionally, since there is no additional photolithography step required to define masking portion 141, manufacturing cost is further reduced.

Furthermore, since masking portion 141 can have its thickness 142 varied during formation, the masking properties of the portion can easily be controllably altered to allow implantation blocking action where dopant species penetrate the masking portion 141 to a shallow depth, or where dopant species penetrate to a greater depth while retaining all the advantages as stated above.

Figure 4:
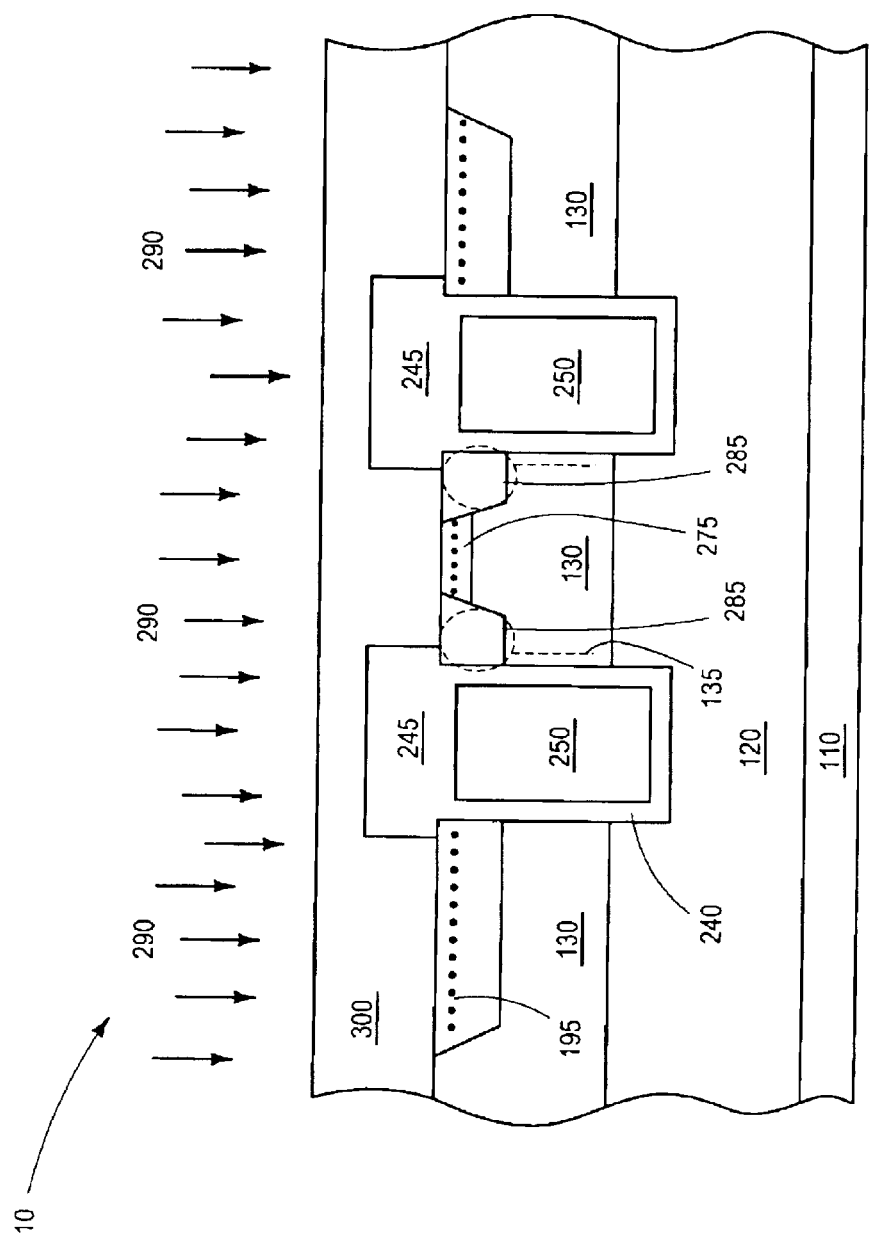
FIG. 4 is a cross-sectional view of the semiconductor device after a fourth fabrication stage.

FIG. 4 shows a cross-sectional view of transistor 10 after a fourth fabrication stage. An inter layer dielectric (ILD) material 245 such as silicon dioxide is formed to a thickness of about 0.5 micrometers on the surface. A contact photolithographic step is then performed for defining a contact etch. The ILD material and the masking portion 141 are removed from the exposed contact regions using standard etch techniques. Subsequent to the contact etch, a p+ enhancement implant 290 is performed to provide a low resistance base contact 275. The source is then annealed at eight hundred to one thousand degrees Celsius for approximately thirty minutes. Channel region or channel 135 conducts current between the source and drain when the device 10 is turned on. A metal such as aluminum is then formed on the surface as an electrode, a photo step is then used to pattern the metal to form the source and gate electrodes of the transistor. The wafer is then thinned to the required thickness by grinding the backside, and a metal is then deposited on the backside to form the drain electrode of the transistor. Thus, transistor 10 is formed, having a channel 135, source 285, drain 120, and gate 250.

Figure 5:
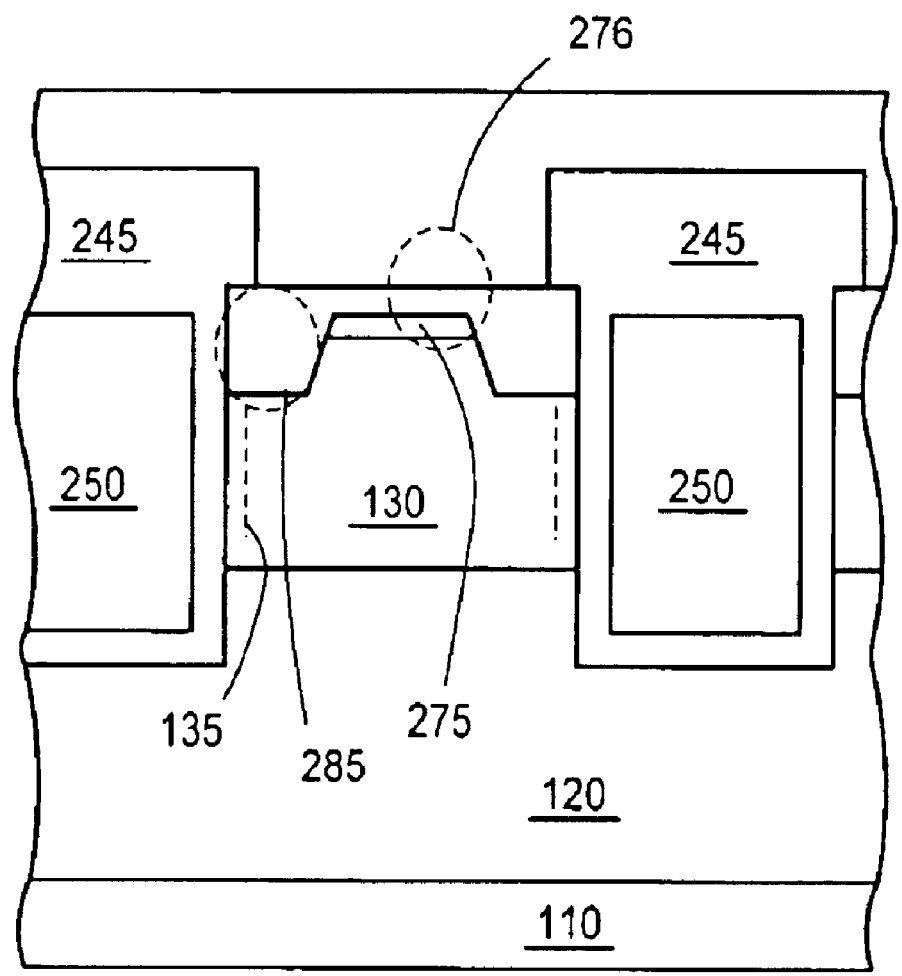
FIG. 5 is a cross-sectional view of an alternate embodiment of the semiconductor device.

FIG. 5 shows a cross-sectional view of an alternate embodiment of transistor 10 in which the masking portion 141 is used to partially mask the source such that a portion of the source implant is allowed under the masking portion 141, to form source 276 junction having a deep portion 285 adjacent to the trench sidewall 160, and a shallower portion 276 in the middle to improve the performance characteristics. A p+ enhancement implant is performed, which is deeper than the shallow central portion of the source, but shallower than the deep portions of the source near the trench sidewalls. The deep portions of the source formed in the manner above prevent the p+ implant from affecting the dopant concentrations in the channel, which prevents the threshold voltage ($V_{TH}$) from being adversely effected. Additionally, the p+ implant in the center of the source region reduces the base resistance, which improves avalanche energy characteristics. Although not shown, the oxide block of above can block the entire source implant in the central portion, such that the p+ enhancement implant would extend to the surface.

The simple method described above is compatible with standard semiconductor processing, and results in a low cost, high channel density trench power MOSFET with a precisely located base contact and source region.

SUMMARY OF THE INVENTION

In summary, the present invention provides a method of making a semiconductor device 10 by forming a first dielectric layer 140 on a substrate, etching through the first dielectric layer to form a trench 150, having a channel region 135 on a sidewall of the trench, in a semiconductor substrate, and laterally removing a portion of the first dielectric layer adjacent to the sidewall 160 of the trench above the channel for defining a source region 280 of the semiconductor device.

What is claimed is:

1. A method of making a semiconductor device comprising the steps of:
    forming a first dielectric layer on a substrate;
    forming a second dielectric layer over the first dielectric layer;
    forming an opening in the first and second dielectric layers;
    forming a trench in the substrate, wherein the trench has a sidewall;
    laterally removing a portion of the first dielectric layer adjacent to the sidewall to leave a masking portion over the substrate; and forming a doped region in the substrate using the masking portion to control dopant introduction into the substrate.

2. The method of claim 1, wherein the step of forming the doped region includes forming the doped region wherein the masking portion partially blocks dopant introduction into the substrate so that the doped region includes a deep portion and a shallower portion.

3. The method of claim 1, wherein the step of forming the doped region includes forming the doped region wherein the masking portion substantially blocks dopant introduction into the substrate below the masking portion.

4. The method of claim 1, wherein the step of forming the first dielectric layer on the substrate includes forming the first dielectric layer on a substrate comprising a base region of a first conductivity type formed in a layer of second conductivity type semiconductor material, and wherein the step of forming the trench includes forming a trench extending through the base region into the layer of second conductivity type semiconductor material.

5. The method of claim 4, wherein the step of forming the doped region includes forming a source region of the second conductivity type.

6. The method of claim 1, wherein the step of laterally removing the portion of the first dielectric layer includes etching the first dielectric with one of a wet chemical etch or an isotropic plasma etch, and wherein the step of laterally removing includes removing generally equal amounts on laterally opposing sides of the first dielectric layer.

7. The method of claim 1, wherein the step of forming the first dielectric layer includes forming a thermally grown silicon dioxide layer.

8. The method of claim 1, wherein the step of forming the second dielectric layer includes depositing a silicon nitride layer.

9. A method of making a transistor comprising the steps of:
providing a semiconductor substrate of a first conductivity type, wherein the semiconductor substrate has a first major surface and a base region of a second conductivity type formed therein;
forming first and second trenches in the semiconductor substrate, wherein the first and second trenches are spaced apart, and wherein the first trench has a first sidewall, and wherein the second trench has a second sidewall;
forming a masking portion on the first major surface between the first and second trenches, wherein the masking portion is formed independent of a photolithographic process step;
forming first and second doped regions of the first conductivity type in the semiconductor substrate using the masking portion as a dopant mask, wherein the first doped region is adjacent the first sidewall, and wherein the second doped region is adjacent the second sidewall;
forming a gate dielectric layer on the first and second sidewalls; and
placing a first conductive material in the first and second trenches to form a gate structure.

10. The method of claim 9, wherein the step of forming the masking portion comprises the steps of:

forming a first dielectric layer over the first major surface:
forming a second dielectric layer over the first dielectric;
forming openings in the first and second dielectric layers;
forming the first and second trenches in the semiconductor substrate through the openings;
laterally removing portions of the first dielectric layer under the second dielectric layer and adjacent the first and second sidewalls; and
removing the second dielectric layer leaving the masking portion.

11. The method of claim 10, wherein the step of forming the masking portion includes forming a masking portion having a thickness that partially blocks dopant penetration into the semiconductor substrate when forming the first and second doped regions so a shallow doped portion is formed between the first and second doped regions.

12. The method of claim 10, wherein the step of laterally removing portions of the first dielectric layer includes etching the first dielectric with a wet chemistry.

13. The method of claim 10, wherein the step of laterally removing portions of the first dielectric layer includes plasma etching the first dielectric layer.

14. A method of making a transistor comprising the steps of:
providing a substrate of a first conductivity type and having a first doped region of a second conductivity type formed therein;
forming a first layer over the semiconductor substrate;
forming a second layer over the first layer;
forming an opening in the first and second layers;
forming a trench in the semiconductor substrate adjacent the opening;
removing a lateral portion of the first layer under the second layer to form a masking portion;
removing the second layer leaving the masking portion; and
forming a second doped region in the semiconductor substrate using the masking portion to control dopant incorporation into the semiconductor substrate.

15. The method of claim 14, wherein the step of forming the first layer includes forming a silicon oxide layer.

16. The method of claim 14, wherein the step of forming the second layer includes forming a silicon nitride layer.

17. The method of claim 14, further including the steps of:
forming a gate dielectric layer on sidewalls of the trench;
forming a conductive layer over the gate dielectric layer; and
forming an ILD over the conductive layer.

18. The method of claim 14, wherein the step of forming the second doped region includes forming a second doped region have a deep portion adjacent the trench, and a shallower portion adjacent the deep portion.

19. The method of claim 14, wherein the step of removing the lateral portion includes etching the first layer with a wet chemistry.

20. The method of claim 14, wherein the step of removing the lateral portion includes etching the first layer with a isotropic plasma etch.

* * * * *